(12) United States Patent
Chang et al.

(10) Patent No.: US 10,825,973 B2
(45) Date of Patent: Nov. 3, 2020

(54) LED LEAD FRAME STRUCTURE

(71) Applicants: U.D.ELECTRONIC CORP., Taoyuan (TW); U.D.(DONGGUAN) ELECTRONIC TECHNOLOGY CORP., Dongguan (CN); U.D.(ZHONG JIANG) ELECTRONIC CORP., Deyang (CN)

(72) Inventors: Chih-Kai Chang, Taoyuan (TW); Qiang Lee, Taoyuan (TW); Yao-Ching Huang, Taoyuan (TW)

(73) Assignees: U.D. ELECTRONIC CORP., Taoyuan (TW); U.D. (DONGGUAN) ELECTRONIC TECHNOLOGY CORP., Dongguan (CN); U.D. (ZHONG JIANG) ELECTRONIC CORP., Deyang (CN)

( * ) Notice: Subject to any disclaimer, the term of this patent is extended or adjusted under 35 U.S.C. 154(b) by 229 days.

(21) Appl. No.: 15/942,878

(22) Filed: Apr. 2, 2018

(65) Prior Publication Data
US 2018/0301607 A1  Oct. 18, 2018

(30) Foreign Application Priority Data

Apr. 13, 2017 (CN) ..................... 2017 2 0385404 U

(51) Int. Cl.
*H01L 33/62* (2010.01)
(52) U.S. Cl.
CPC ................................... *H01L 33/62* (2013.01)

(58) Field of Classification Search
CPC ........... H01L 21/4821; H01L 2924/171; H01L 2924/1711; H01L 2924/1715; Y10T 428/12188; Y10T 428/12194
See application file for complete search history.

(56) References Cited

U.S. PATENT DOCUMENTS

| | | | | | |
|---|---|---|---|---|---|
| 1,984,057 | A | * | 12/1934 | Comyn | B01D 17/0211 210/512.1 |
| 3,423,516 | A | * | 1/1969 | Segerson | H01L 23/49562 174/526 |
| 3,444,441 | A | * | 5/1969 | Helda | B29C 45/14655 257/670 |
| 3,609,475 | A | * | 9/1971 | Kaposhilin | H01L 33/52 257/99 |
| 3,621,114 | A | * | 11/1971 | Ref | H01L 23/49541 257/694 |
| 3,660,669 | A | * | 5/1972 | Grenon | H01L 31/16 250/551 |

(Continued)

*Primary Examiner* — Adam Krupicka

(57) ABSTRACT

An LED lead frame structure includes a lamp body, and a stamped metal frame including transversely spaced and longitudinally extended first longitudinal frame portion and second longitudinal frame portion, longitudinally spaced and transversely extended first transverse frame portion and second transverse frame portion and a material strip frame. The first transverse frame portion is integrally connected to a rear end of the first longitudinal frame portion. The second transverse frame portions integrally connected to a rear end of the second longitudinal frame portion. This product can be regarded as a semi-finished product having a bendable structure and can be bent again if necessary, and thus, this design can reduce the number of times in bending lamp pins.

8 Claims, 5 Drawing Sheets

(56) References Cited

U.S. PATENT DOCUMENTS

| | | | | |
|---|---|---|---|---|
| 3,764,862 | A | * | 10/1973 | Jankowski .............. H01L 33/60 257/98 |
| 4,032,963 | A | * | 6/1977 | Thome .................. H01L 33/483 257/100 |
| 4,129,682 | A | * | 12/1978 | Stewart ............. H01L 23/49562 257/E23.044 |
| 4,616,250 | A | * | 10/1986 | Folk ................. H01L 23/49562 257/674 |
| 4,949,156 | A | * | 8/1990 | Mii .......................... G09F 9/33 257/666 |
| 4,979,017 | A | * | 12/1990 | Mii .................. H01L 23/49562 257/676 |
| 5,208,481 | A | * | 5/1993 | Kurita ................. H01L 21/4842 257/666 |
| 5,274,911 | A | * | 1/1994 | Toro .................... H01L 21/4821 29/827 |
| 5,455,199 | A | * | 10/1995 | Sakamoto ............. H01L 33/005 438/26 |
| 8,318,513 | B2 | * | 11/2012 | Chuang .................. B29C 39/10 257/E21.504 |
| 2003/0168989 | A1 | * | 9/2003 | Hen .................... H01L 25/0753 315/56 |
| 2008/0063738 | A1 | * | 3/2008 | Lin ........................ B29C 41/20 425/121 |

\* cited by examiner

LED LEAD FRAME STRUCTURE

BACKGROUND OF THE INVENTION

1. Field of the Invention

The present invention relates to LED technology and more particularly, to a LED lead frame structure, which solves the problems of the existing LED lead frame structures, such as the long lead frame bending time and ease of damage of the lamp body.

2. Description of the Related Art

A conventional LED lead frame structure generally comprises a lamp body and a stamped metal frame. The metal frame consists of multiple LED lamp pin sets that are connected to a material strip. Each LED lamp pin set is composed of two longitudinal portions. The shaped LED lamp pins are straight pins. In order to meet different product structure requirements, the LED lamp pins need to be bent out of different shapes. In the shape forming process, the straight type LED lamp pins need to be bent twice to achieve the desired shape. This method will result in long LED lamp pin bending time and waste of man-hour costs and can cause damage to the lamp body during the bending process.

SUMMARY OF THE INVENTION

The present invention has been accomplished under the circumstances in view. It is therefore the main object of the present invention to provide a LED lead frame structure, which can effectively solve the problems of the existing LED lead frame structures, such as the long lead frame bending time and ease of damage of the lamp body.

To achieve this and other objects of the present invention, a LED lead frame structure comprises a lamp body and a stamped metal frame. The stamped metal frame comprises a first longitudinal frame portion, a second longitudinal frame portion, a first transverse frame portion, a second transverse frame portion and a material strip frame. The first longitudinal frame portion and the second longitudinal frame portion are transversely spaced and longitudinally extended. The first transverse frame portion and the second transverse frame portion are longitudinally spaced and transversely extended. The first transverse frame portion is integrally connected to a rear end of the first longitudinal frame portion. The second transverse frame portion is integrally connected to a rear end of the second longitudinal frame portion. The material strip frame is disposed at a rear side relative to the first longitudinal frame portion, the second longitudinal frame portion, the first transverse frame portion and the second transverse frame portion. The material strip frame and the rear end of the second longitudinal frame portion are integrally connected to the second transverse frame portion. The lamp body is disposed at an opposing front side relative to the first longitudinal frame portion and the second longitudinal frame portion. Further, an opposing front end of the first longitudinal frame portion and an opposing front end of the second longitudinal frame portion are inserted into the lamp body and electrically conducted with the lamp body.

DETAILED DESCRIPTION OF THE PREFERRED EMBODIMENT

Figure 1:
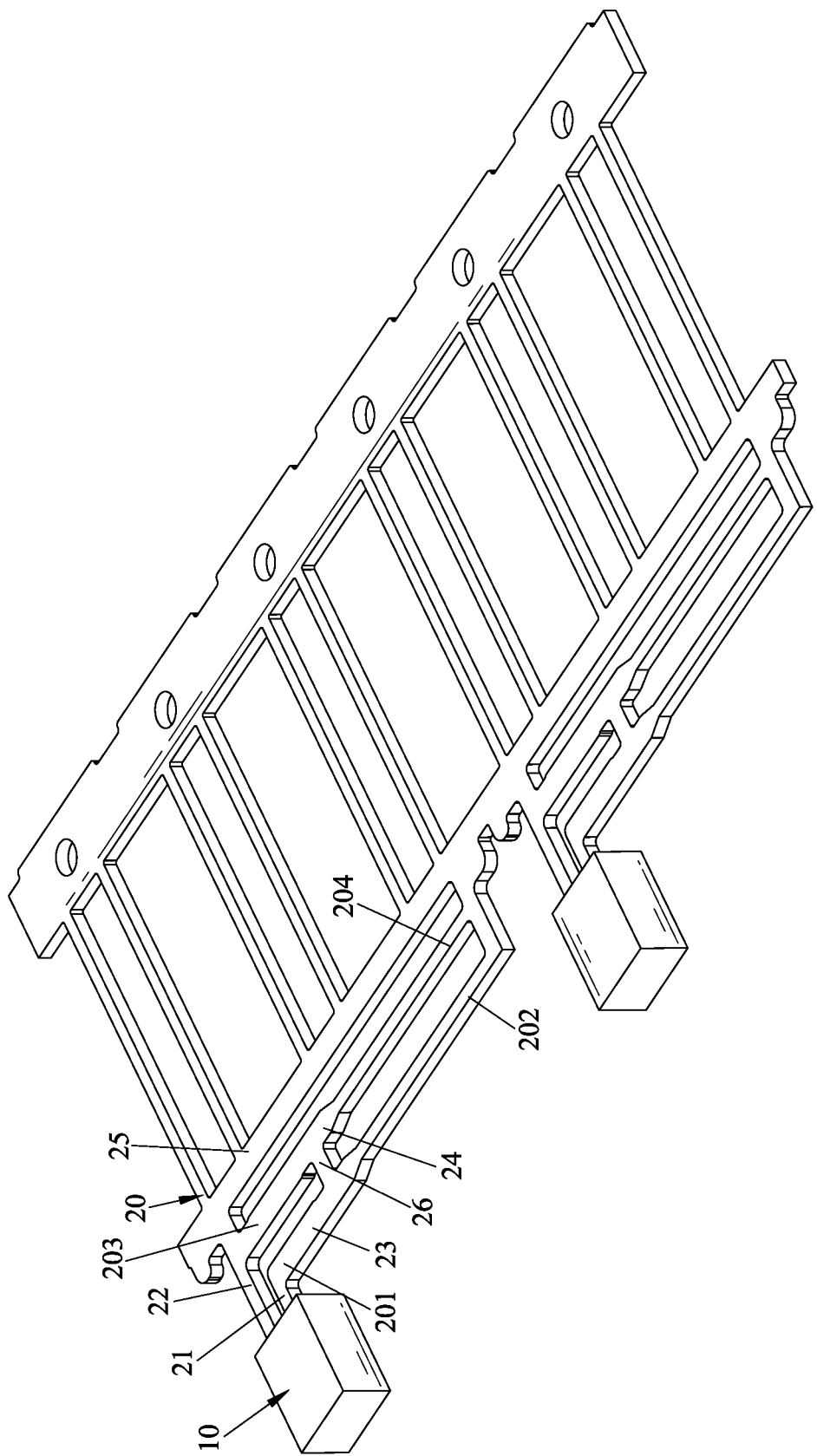
FIG. 1 is a schematic oblique top elevational view of a LED lead frame structure in accordance with a first embodiment of the present invention.
Figure 2:
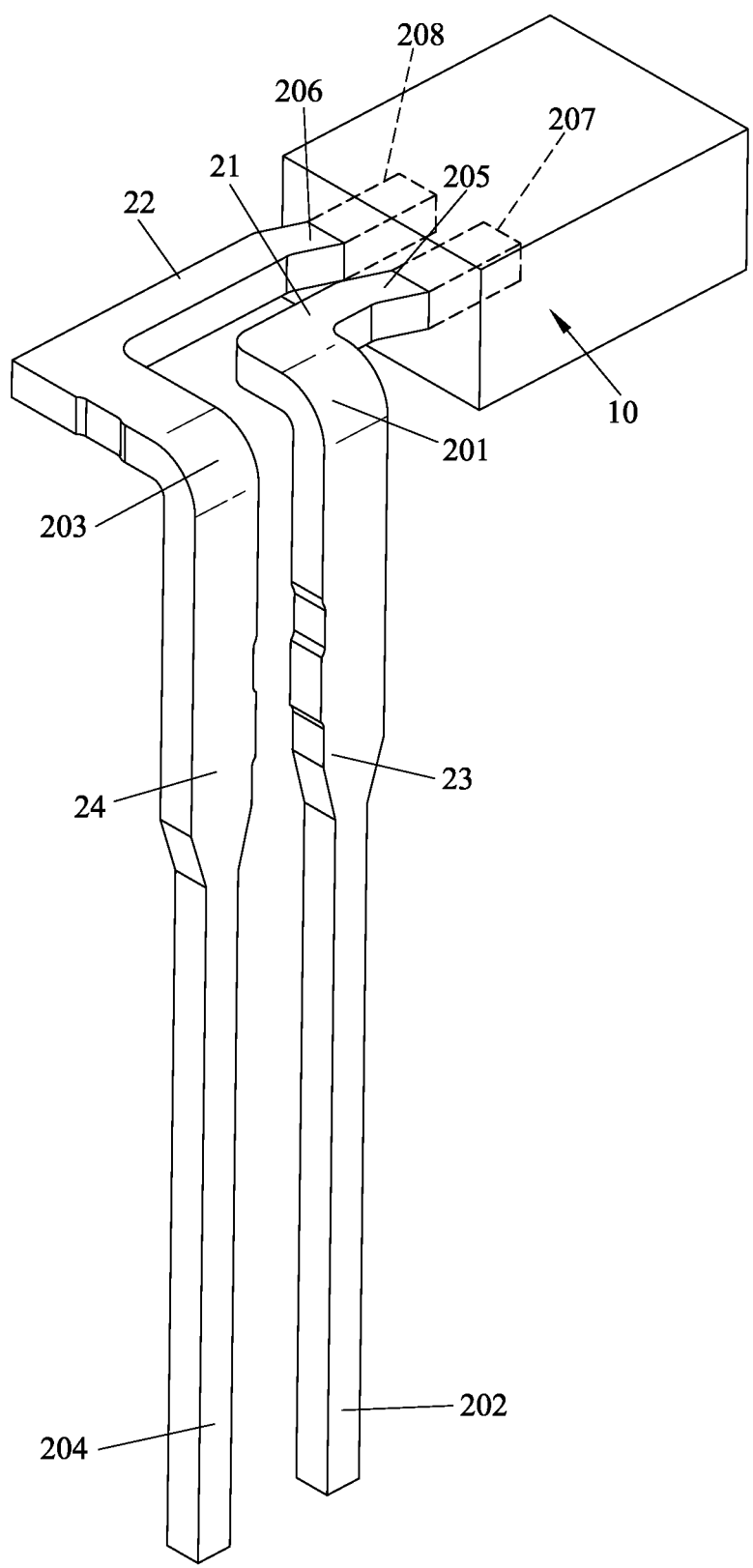
FIG. 2 is an elevational view of the finished product of the first embodiment of the present invention.

Referring to FIGS. 1 and 2, a LED lead frame structure in accordance with a first embodiment of the present invention is shown. The LED lead frame structure comprises a lamp body 10 and a stamped metal frame 20.

The metal frame 20 comprises a first longitudinal frame portion 21, a second longitudinal frame portion 22, a first transverse frame portion 23, a second transverse frame portion 24 and a material strip frame 25. The first longitudinal frame portion 21 and the second longitudinal frame portion 22 are transversely spaced and longitudinally extended. The first transverse frame portion 23 and the second transverse frame portion 24 are longitudinally spaced and transversely extended. The first transverse frame portion 23 is integrally connected to a rear end of the first longitudinal frame portion 21. The second transverse frame portion 24 is integrally connected to a rear end of the second longitudinal frame portion 22. The material strip frame 25 is disposed at a rear side relative to the first longitudinal frame portion 21, the second longitudinal frame portion 22, the first transverse frame portion 23 and the second transverse frame portion 24. The material strip frame 25 and the rear end of the second longitudinal frame portion 22 are integrally connected to the second transverse frame portion 24.

The lamp body 10 is disposed at an opposing front side relative to the first longitudinal frame portion 21 and the second longitudinal frame portion 22. An opposing front end of the first longitudinal frame portion 21 and an opposing front end of the second longitudinal frame portion 22 are inserted into the lamp body 10 and electrically conducted with the lamp body 10.

In this embodiment, two material strip blocks 26 are connected between the first transverse frame portion 23 and the second transverse frame portion 24, wherein one material strip block 26 is integrally connected between a middle part of the first transverse frame portion 23 and a middle part of the second transverse frame portion 24; the other material strip block 26 is integrally connected between a rear end of the first transverse frame portion 23 and a rear end of the second transverse frame portion 24. The first longitudinal frame portion 21, the second longitudinal frame portion 22, the first transverse frame portion 23 and the second transverse frame portion 24 are strip-shaped. Further, the first transverse frame portion 23 comprises a first bending portion 201 at the front end thereof. The first transverse frame portion 23 comprises a first bonding portion 202 at the rear end thereof. The width of the first bending portion 201 is larger than the width of the first bonding portion 202 so that the bending direction of the first transverse frame portion 23 can be better ensured, and the first transverse frame portion 23 can be prevented from skewing to the left and right. The second transverse frame portion 24 comprises a second bending portion 203 at the front end thereof. The second transverse frame portion 24 comprises a second bonding portion 204 at the rear end thereof. The width of the second bending portion 203 is larger than the width of the second bonding portion 204 so that the bending direction of the second transverse frame portion 24 can be better ensured, and the second transverse frame portion 24 can be prevented from skewing to the left and right. Further, the first longitudinal frame portion 21 has the front end thereof terminating in a first terminal segment 205 and then a first contact portion (not shown). The first contact portion is embedded in the lamp body 10. The first terminal segment 205 extends obliquely with respect to the first contact portion toward a side away from the direction in which the first transverse frame portion 23 extends. In this manner, the first bending portion 201 is made to further provide a space during bending, and stress on the lamp body 10 during bending can be reduced. The second longitudinal frame portion 22 has the front end thereof terminating in a second terminal segment 206 and then a second contact portion (not shown). The second contact portion is embedded in the lamp body 10. The second terminal segment 206 extends obliquely with respect to the second contact portion toward a side away from the direction in which the second transverse frame portion 24 extends. In this manner, the second bending portion 203 is made to further provide a space during bending, and stress on the lamp body 10 during bending can be reduced.

In the production, as shown in FIG. 1, the metal frame 20 is first stamped, and then the lamp body 10 is molded so that the front end of the first longitudinal frame portion 21 and the front end of the second longitudinal frame portion 22 are inserted into the lamp body 10 and electrically connected with the lamp body 10. Then, the material strip frame 25 and the material strip blocks 26 are cut off, and then the first transverse frame portion 23 and the second transverse frame portion 24 are bent downward to obtain the finished product (as shown in FIG. 2).

Figure 3:
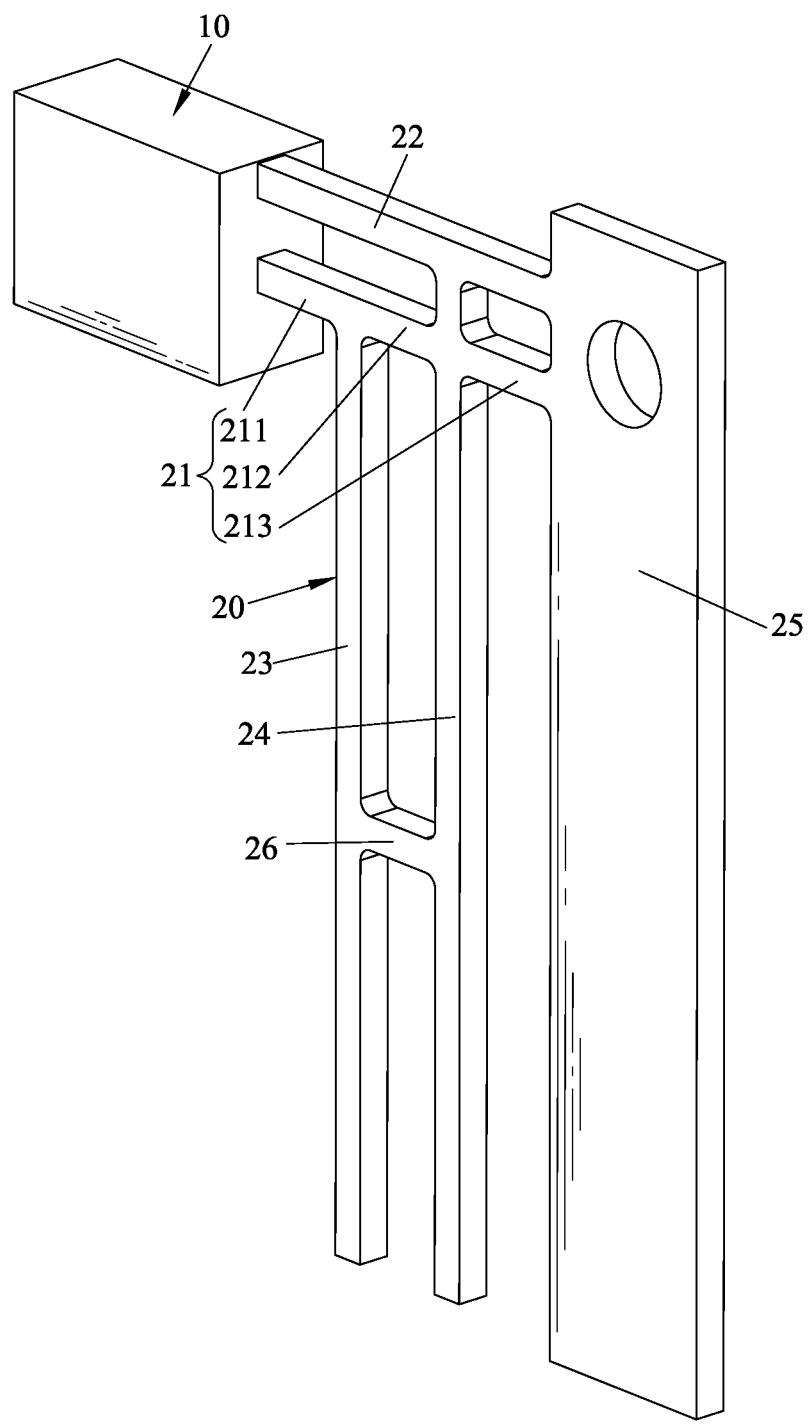
FIG. 3 is a schematic oblique top elevational view of a LED lead frame structure in accordance with a second embodiment of the present invention.
Figure 5:
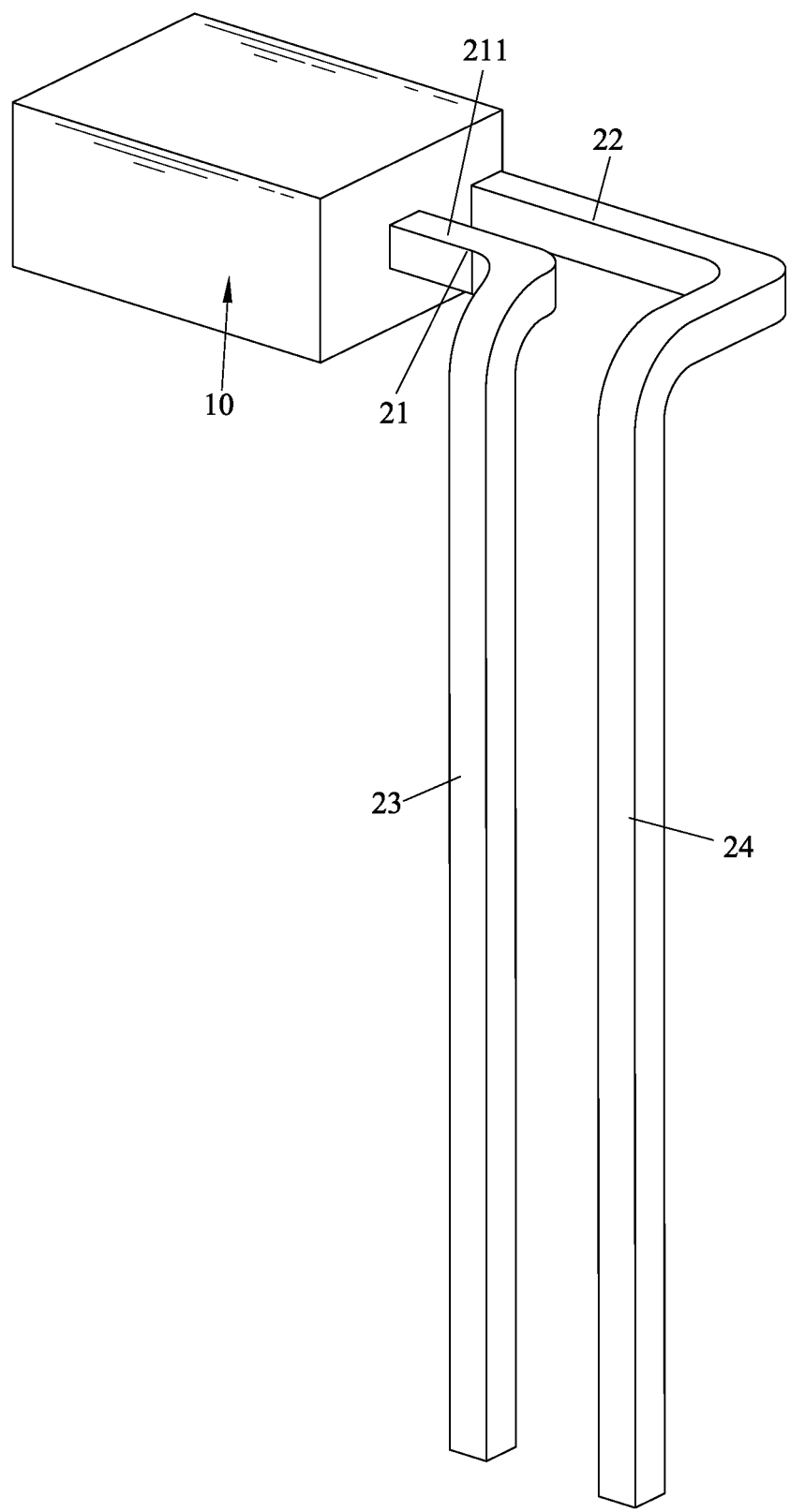
FIG. 5 is an elevational view of the finished product of the second embodiment of the present invention.

Referring to FIG. 3 and FIG. 5, a LED lead frame structure in accordance with a second embodiment of the present invention is shown. This second embodiment is substantially similar to the aforesaid first embodiment with the exceptions as outlined hereinafter.

In this embodiment, the first longitudinal frame portion 21 comprises a front segment 211, a middle segment 212 and a rear segment 213. The front segment 211 is integrally connected between the lamp body 10 and one end of the first transverse frame portion 23. The middle segment 212 is integrally connected between the first transverse frame portion 23 and the second transverse frame portion 24. The rear segment 213 is integrally connected between the second transverse frame portion 24 and the material strip frame 25. Further, the first longitudinal frame portion 21, the second longitudinal frame portion 22, the first transverse frame portion 23 and the second transverse frame portion 24 are all straight bars.

Figure 4:
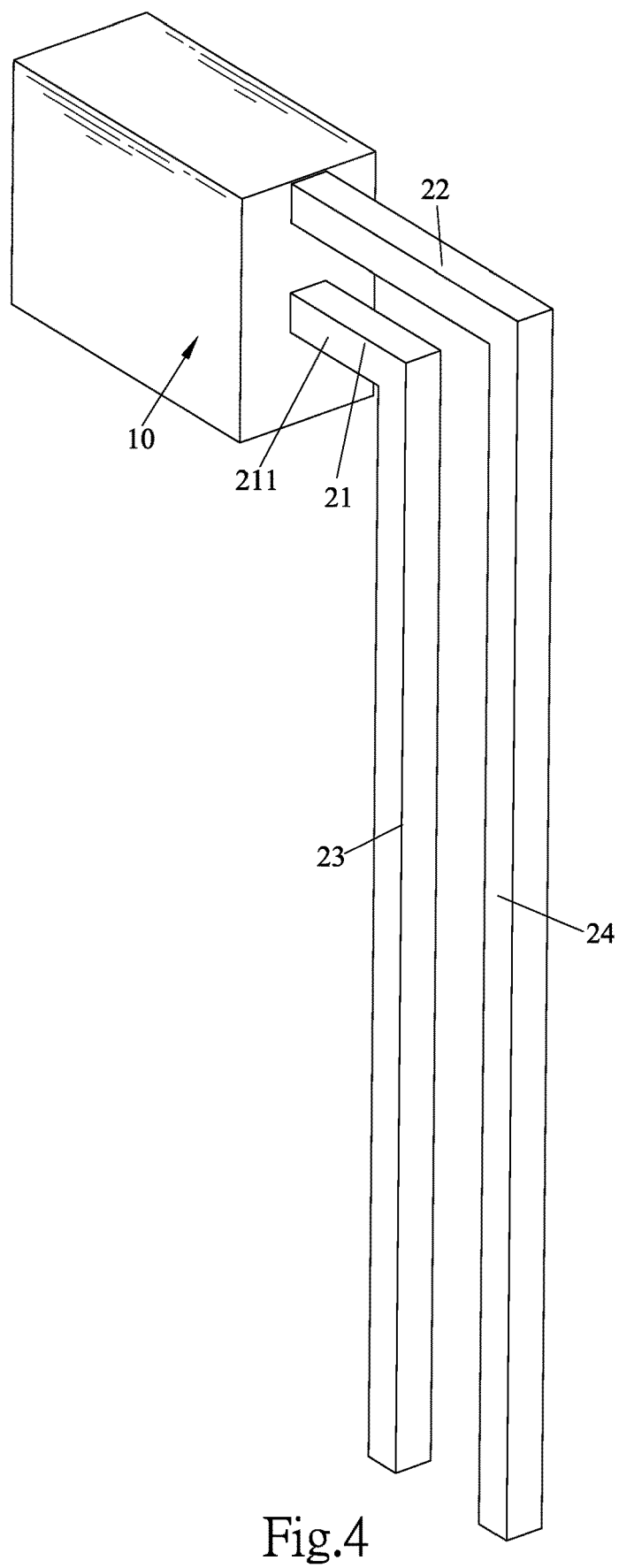
FIG. 4 is an elevational view of the second embodiment of the present invention after removal of the material strip.

In the production, as shown in FIG. 3, the metal frame 20 is first stamped, and then the lamp body 10 is molded so that the front end of the first longitudinal frame portion 21 and the front end of the second longitudinal frame portion 22 are inserted into the lamp body 10 and electrically connected with the lamp body 10. Then, if necessary, the first transverse frame portion 23, the second transverse frame portion 24, the material strip frame 25 and the material strip blocks 26 are cut off, leaving only the first longitudinal frame portion 21 and the second longitudinal frame portion 22, or with the material strip frame 25, the material strip block 26, the middle segment 212 and the rear segment 213 cut off to obtain the structure shown in FIG. 4. The structure at this time may be a finished product or a semi-finished product. When it is a semi-finished product, then the first transverse frame portion 23 and the second transverse frame portion 24 are bent downwards to obtain another product (as shown in FIG. 5), which can be loaded into another connector.

The design of the present invention is focused on: forming a first longitudinal frame portion, a second longitudinal frame portion, a first transverse frame portion and a second transverse frame portion by one-time stamping. During production, after cutting off the material strip, the product can be used after bending the first transverse frame portion and the second transverse frame portion once.

On the one hand, the LED lead frame with the built-in bending structure can be regarded as a semi-finished product. If necessary, the LED lead frame can be bent again. This can reduce the number of times in bending the lamp pins and effectively prevent the lamp pins from damaging the lamp body during bending, reducing defective products and saving man-hours costs. On the other hand, the lamp pins can be cut according to different needs to obtain a different structure of the finished product, enhancing flexibility.

What the invention claimed is:

1. A LED lead frame structure, comprising a lamp body and a stamped metal frame, wherein said stamped metal frame comprises a first longitudinal frame portion, a second longitudinal frame portion, a first transverse frame portion, a second transverse frame portion and a material strip frame, said first longitudinal frame portion and said second longitudinal frame portion being transversely spaced and longitudinally extended, said first transverse frame portion and said second transverse frame portion being longitudinally spaced and transversely extended, said first transverse frame portion being integrally connected to a rear end of said first longitudinal frame portion, said second transverse frame portion being integrally connected to a rear end of said second longitudinal frame portion, said material strip frame being disposed at a rear side relative to said first longitudinal frame portion, said second longitudinal frame portion, said first transverse frame portion and said second transverse frame portion, said material strip frame and the rear end of said second longitudinal frame portion being integrally connected to said second transverse frame portion, an opposing front end of said first longitudinal frame portion and an opposing front end of said second longitudinal frame portion being inserted into said lamp body and electrically conducted with said lamp body; said lamp body is disposed at an opposing front side relative to said first longitudinal frame portion and said second longitudinal frame portion;

wherein said first transverse frame portion comprises a first bending portion at the front end thereof and a first bonding portion at the rear end thereof, a width of said first bending portion being larger than a width of said first bonding portion; said second transverse frame portion comprises a second bending portion at the front end thereof and a second bonding portion at the rear end thereof, a width of said second bending portion being larger than a width of said second bonding portion.

2. The LED lead frame structure as claimed in claim 1, wherein said stamped metal frame further comprises at least one material strip block connected between said first transverse frame portion and said second transverse frame portion.

3. The LED lead frame structure as claimed in claim 2, wherein the number of said at least one material strip block is 2, one said material strip block being integrally connected between a middle part of said first transverse frame portion and a middle part of said second transverse frame portion, the other said material strip block integrally connected between a rear end of said first transverse frame portion and a rear end of said second transverse frame portion.

4. The LED lead frame structure as claimed in claim 1, wherein said first longitudinal frame portion, said second longitudinal frame portion, said first transverse frame portion and said second transverse frame portion are strip-shaped.

5. The LED lead frame structure as claimed in claim 1, wherein said first longitudinal frame portion has the front end thereof terminating in a first terminal segment and then a first contact portion, said first contact portion being embedded in said lamp body, said first terminal segment extending obliquely with respect to said first contact portion toward a side away from the direction in which said first transverse frame portion extends.

6. The LED lead frame structure as claimed in claim 1, wherein said second longitudinal frame portion has the front end thereof terminating in a second terminal segment and then a second contact portion, said second contact portion being embedded in said lamp body, said second terminal segment extending obliquely with respect to said second contact portion toward a side away from the direction in which said second transverse frame portion extends.

7. The LED lead frame structure as claimed in claim 1, wherein said first longitudinal frame portion comprises a front segment, a middle segment and a rear segment, said front segment being integrally connected between said lamp body and one end of said first transverse frame portion, said middle segment being integrally connected between said first transverse frame portion and said second transverse frame portion, said rear segment being integrally connected between said second transverse frame portion and said material strip frame.

8. The LED lead frame structure as claimed in claim 1, wherein said first longitudinal frame portion, said second longitudinal frame portion, said first transverse frame portion and said second transverse frame portion are straight bars.

\* \* \* \* \*